United States Patent
Min et al.

(10) Patent No.: US 9,589,967 B2
(45) Date of Patent: Mar. 7, 2017

(54) FAST PROGRAMMING ANTIFUSE AND METHOD OF MANUFACTURE

(71) Applicant: Freescale Semiconductor, Inc., Austin, TX (US)

(72) Inventors: Won Gi Min, Chandler, MN (US); Jiang-Kai Zuo, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 180 days.

(21) Appl. No.: 14/159,617

(22) Filed: Jan. 21, 2014

(65) Prior Publication Data

US 2015/0206892 A1    Jul. 23, 2015

(51) Int. Cl.
*G11C 11/34* (2006.01)
*H01L 27/112* (2006.01)
*H01L 23/525* (2006.01)
*G11C 17/16* (2006.01)

(52) U.S. Cl.
CPC .... *H01L 27/11206* (2013.01); *H01L 23/5252* (2013.01); *G11C 17/16* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 7,064,410 B2 | 6/2006 | Radens et al. | |
| 7,256,471 B2 | 8/2007 | Min et al. | |
| 7,553,704 B2 | 6/2009 | Min et al. | |
| 7,723,820 B2 | 5/2010 | Kim et al. | |
| 7,880,266 B2 | 2/2011 | Park et al. | |
| 7,982,285 B2 | 7/2011 | Park et al. | |
| 8,350,264 B2 | 1/2013 | Li et al. | |
| 9,105,310 B2* | 8/2015 | Li | G11C 17/08 |
| 2005/0073898 A1* | 4/2005 | Scheuerlein | B82Y 10/00 365/230.03 |
| 2011/0108926 A1* | 5/2011 | Bahl | H01L 27/112 257/379 |
| 2012/0313180 A1* | 12/2012 | Mitchell | G11C 17/16 257/368 |
| 2013/0161761 A1* | 6/2013 | Luan | G11C 17/16 257/379 |
| 2014/0175601 A1* | 6/2014 | Ho | H01L 23/5252 257/530 |
| 2015/0097236 A1* | 4/2015 | Tsai | H01L 29/7816 257/339 |
| 2016/0087083 A1* | 3/2016 | Tsai | H01L 29/7816 438/286 |

* cited by examiner

*Primary Examiner* — Ali Naraghi

(57) ABSTRACT

The embodiments described herein provide an antifuse that includes a substrate material and an isolation trench formed in the substrate material, where the isolation trench has a first side and a second side opposite the first side. An electrode is positioned above the substrate material and proximate to the first side of the isolation trench. An insulating layer is disposed between the electrode and the substrate material. So configured, a voltage or current applied between the electrode and the substrate material causes a rupture in the insulating layer and creates a current path through the insulating layer and under the isolation trench to the substrate material proximate the second side of the isolation trench.

19 Claims, 4 Drawing Sheets

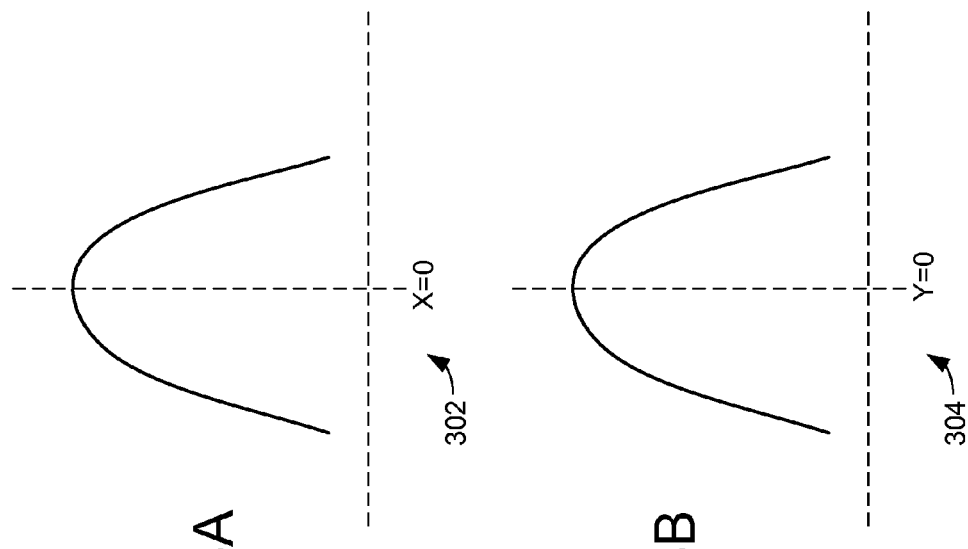
FIG. 3A
FIG. 3B
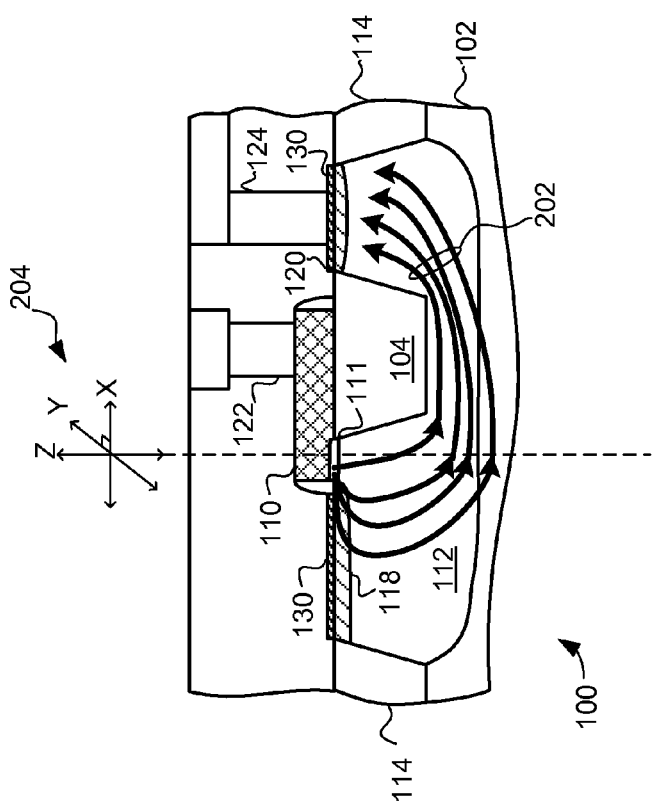
FIG. 2

FAST PROGRAMMING ANTIFUSE AND METHOD OF MANUFACTURE

TECHNICAL FIELD

Embodiments described herein generally relate to semiconductor integrated circuit technology, and more particularly to antifuse element structures, and a method of manufacturing antifuse elements, in semiconductor devices.

BACKGROUND

One-time programmable (OTP) elements such as fuses and antifuses have been used in a variety of semiconductor applications. For example, arrays of OTP elements have been used in read only memories (ROMs) for circuit trimming and other uses. When fuse elements are utilized, the device is programmed by blowing fusible links at selected nodes to create open circuits. When antifuse elements are utilized, the device is programmed by creating a short circuit or a low resistance path in a previously open circuit.

A typical antifuse element includes an insulating dielectric layer, such as a gate oxide, between two conducting layers. The unprogrammed state of an antifuse element is an open circuit with intact dielectric. Programming an antifuse creates a shorting path at a damaged point, known as the rupture point, in the dielectric/gate oxide formed by applying a voltage and/or current higher than the dielectric rupture voltage and/or current.

One issue with such antifuses is the time needed to program each antifuse. For example, a typical antifuse can require current to be applied for 10s or even 100s of milliseconds to reliably create a shorting path and program the antifuse. In devices that include large arrays of antifuses, the overall time required to program such a large array can be excessive, leading to decreased production rates and/or increased device costs.

Another issue with such antifuses is reliability. To be effective the programming technique used needs a very high rate of reliability. For example, it is desirable that programming of antifuses result in relatively low resistance variation in the programmed antifuses. Such variation can otherwise negatively impact the performance of the array and the associated device.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 2 is a cross-sectional side view of an antifuse in accordance with an example embodiment;

FIGS. 3A and 3B are graphical representations of temperature profiles of an antifuse in accordance with an example embodiment;

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Figure 5:
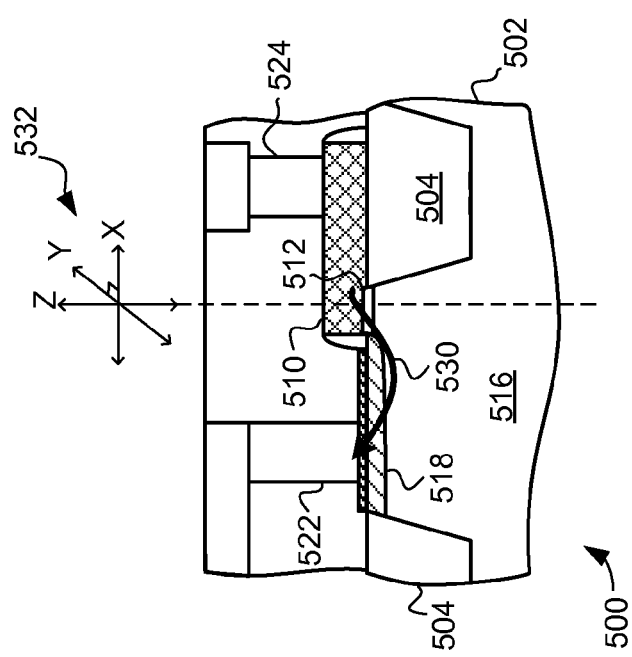
FIG. 5 is a cross sectional side view of an antifuse.

Turning now to FIG. 5, a cross sectional side view of antifuse 500 is illustrated. In general, the antifuse 500 includes a substrate material 502 and isolation trenches 504 formed in the substrate material 502, with an active area 516 defined between the isolation trenches 504. An electrode 510 is positioned above the substrate material 502, and an insulating layer 512 is disposed between the electrode 510 and the substrate material 502. A diffusion region 518 is formed in the top of the active area 516. Contacts 522 and 524 are electrically coupled to the electrode 510 and the diffusion region 518 and can be used to apply a programming voltage or current to the antifuse 500.

So configured an open state initially exists between contacts 522 and 524. To program the antifuse 500 a programming voltage or current is applied to the contacts 522 and 524. This causes the current to flow along a current path between the electrode 510 and the contact 522, illustrated in FIG. 5 as current path 530. This current flow heats the area around the current path 530, which causes a rupture in the insulating layer 512 and creates a permanent short circuit between the contacts 522 and 524.

One issue with an antifuse such as antifuse 500 is the time needed to program. For example, a typical antifuse can require current to be applied for up to 50 milliseconds to reliably create a shorting path and program the antifuse. In general, the greater the heat generated by the programming current the faster the programming of the antifuse.

Figure 6A:
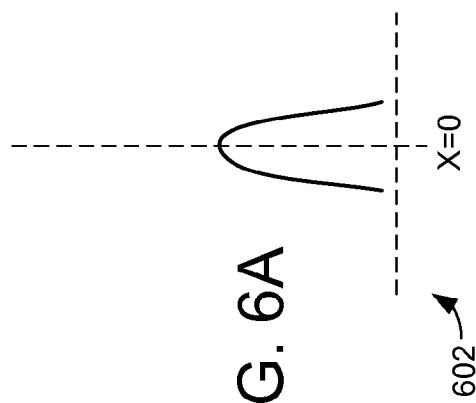
FIGS. 6A and 6B are graphical representations of temperature profiles of an antifuse.
Figure 6B:
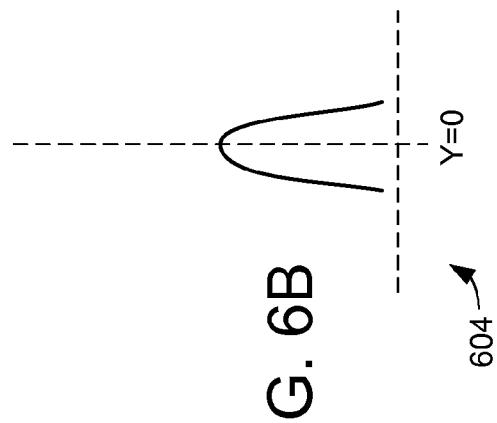

Turning now to FIGS. 6A and 6B, a graphical representation of temperature profiles 602 and 604 caused by an exemplary programming current are illustrated. Specifically, the temperature profiles 602 and 604 show exemplary heating along the X and Y axis defined by coordinate axis 532 of FIG. 5. As shown in this example, the current flow along current path 530 heats over a relatively small portion of the active area 516 (e.g., in the X and Y directions) and has a relatively low magnitude of heat during the application of the programming current. As such, the antifuse 500 would typically require a relatively long time to reliably program.

The embodiments described herein provide antifuse devices and methods that can be utilized in a wide variety of semiconductor devices. In some examples these embodiments may provide an antifuse with decreased time needed for programming. Specifically, these embodiments can facilitate increased heating during the application of current for programming. This increased heating can provide faster programming of the antifuse. Additionally, in some examples the embodiments may provide improved programming reliability by reducing the likelihood of contact damage during programming of the antifuse.

In a first embodiment an antifuse is provided that includes a substrate material and an isolation trench formed in the substrate material, where the isolation trench has a first side and a second side opposite the first side. An electrode is positioned above the substrate material and proximate to the first side of the isolation trench. An insulating layer is disposed between the electrode and the substrate material. So configured, a voltage or current applied between the electrode and the substrate material causes a rupture in the insulating layer and creates a current path through the insulating layer and under the isolation trench to the substrate material proximate to the second side of the isolation trench.

Specifically, this current path flows through the insulating layer, along the first side of the isolation trench, under the isolation trench and along the second side of the isolation trench. This current path increases the heating of the area under the insulating layer, and this can result in faster programming time. Specifically, because the current path has increased resistance the programming current will create increased heat in the area under the insulating layer. This causes a wider portion of the area under the isolation layer to be heated, an increased magnitude of heating, and a reduced time needed for the current to rupture the insulating layer program antifuse.

Figure 1A:
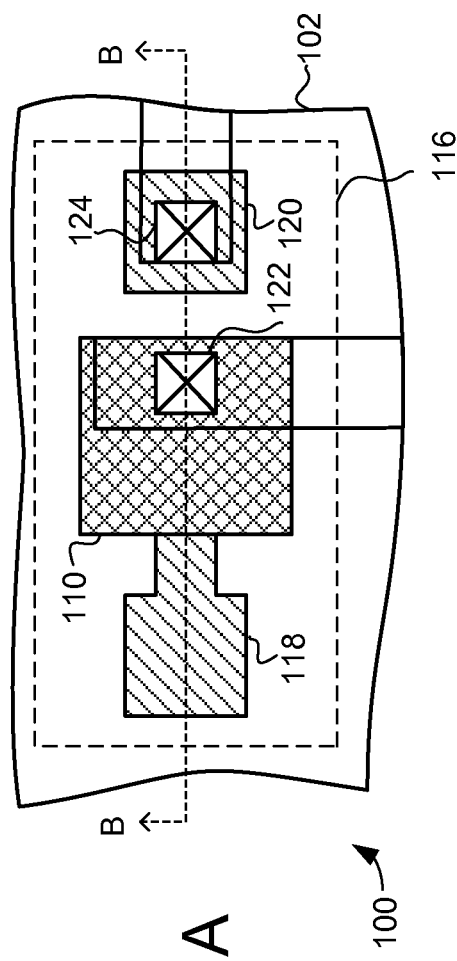
FIGS. 1A and 1B are top and cross-sectional side views of an antifuse in accordance with an example embodiment.
Figure 1B:
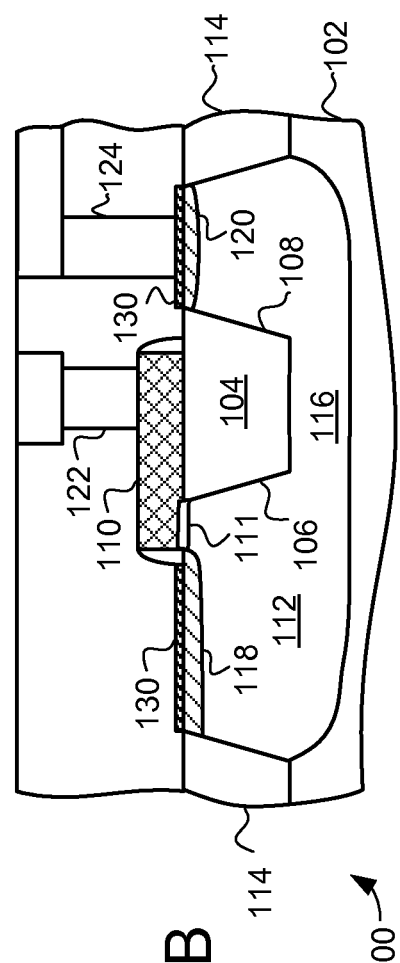

Turning now to FIG. 1A, a top view of an antifuse 100 is illustrated, and FIG. 1B illustrates a cross sectional side view of antifuse 100 taken along line B-B. In general, the antifuse 100 includes a substrate material 102 and an isolation trench 104 formed in the substrate material 102, where the isolation trench has a first side 106 and a second side 108 opposite the first side. An electrode 110 is positioned above the substrate material 102 and having at least a portion proximate to the first side 106 of the isolation trench 104. An insulating layer 111 is formed between the electrode 110 and the active area 112. So configured, a voltage applied between the electrode 110 and the substrate material 102 causes a rupture in the insulating layer and creates a current path from the electrode 110 through the insulating layer 111, along to the first side 106 of the isolation trench 104, and under the isolation trench 104 to the substrate material proximate to the second side 108 of the isolation trench 104. Again, such a current path increases the heating of the area under the insulating layer 111, and this can cause faster programming time. Specifically, because the current path has increased resistance in the area under the insulating layer 111 and proximate to the first side 106 of the isolation trench 104 the current will create increased heat in the area under the insulating layer 111. This can result in faster programming time for the antifuse 100.

The embodiments illustrated in FIGS. 1A and 1B include additional exemplary details of the implementation of the antifuse 100. However, it should be noted that these are merely exemplary, and that other embodiments can be implemented. For example, in the illustrated example the antifuse 100 is formed with a body doping area 116 which is the same doping type as diffusion regions 118 and 120. Specifically, in this illustrated example the body doping area 116 includes a first active area proximate to the first side 106 of the isolation trench 104 and a second active area proximate to the second side 108 of the isolation trench 104. Formed within the body doping area 116 is a first diffusion region 118 and a second diffusion region 120. A silicide layer 130 is formed over the first diffusion region 118 and the second diffusion region 120. A first contact 122 is formed contacting the electrode 110, and a second contact 124 is formed contacting the second diffusion region 120. As will be described in greater detail below the first and second contacts 122 and 124 can be used to apply a current to program the antifuse 100. It should be noted that in this application the term "contact" can refer to any of the elements used to provide electrical connection to the antifuse 100. As such, the term contact can refer to vertical interconnects and/or horizontal conductors used to provide such connections to the antifuse 100. Finally, it should be noted that in this embodiment no contact is formed to provide an electrical connection to first diffusion region 118.

Substrate material 102 may be a standard semiconductor substrate such as a bulk or epitaxial silicon wafer. In some embodiments the substrate material 102 can comprise a semiconductor-on-insulator (SOI) substrate with a buried oxide layer (BOX). Electrode 110 may be formed of polysilicon or any other suitable conductor. Electrode 110 typically is formed wide enough to contain contact 122 or multiple contacts and is formed to overlay at least a portion of body doping area 116. In a typical embodiment the electrode 110 is formed with other electrodes on the device, for example, during the same process steps used to form gate electrodes for transistor gates on the device. The diffusion regions 118 and 120 may be formed with any suitable implant. For example, the diffusion regions 118 and 120 may include heavy n-type or p-type implants to provide for good electrical contact. In such an embodiment the diffusion region 118 can serve to further facilitate the spreading of programming current to the opposite side from current direction and thus facilitate heating over a wider area. In such an embodiment diffusion region 120 serves as an ohmic contact to avoid high non-linear resistance between contact 124 and body doping region 116. In one embodiment the diffusion regions 118 and 120 are formed in the same implantation processes used to form the source/drain regions of transistors.

The insulating layer 111 is formed between electrode 110 and active area 112. In one embodiment the insulating layer 111 is formed using the same process steps used to form gate dielectrics. As such, the insulating layer 111 may be formed using any suitable dielectric material, such as a material suitable for a gate oxide.

In one embodiment the body doping area 116 is a doped n-well in a surface of substrate material 102. For example, the body doping area 116 may be formed to have the same doping type as the electrode 110, diffusion regions 118 and 120. In such embodiments the n-well can provide a final lower resistance after programming. However, in other alternatives the body doping area 112 is formed in a highly doped p-well, and in such embodiments the electrode 110, diffusion regions 118 and 120 are likewise p-doped. As noted above, in one embodiment the body doping area 116 is composed of a first active area that is formed at an uppermost surface of the substrate material 102 and proximate to the first side of the isolation trench 104, and a second active area that is formed at the uppermost surface of the substrate material 102 and proximate to the second side of the isolation trench 104. In such an embodiment both the first active area and the second active area would comprise an electrically conductive doped regions, and in some cases can be considered parts of the same electrically conductive doped region.

In general, the antifuse 100 functions as an antifuse by becoming conductive after undergoing programming. Prior to any programming event, wherein a voltage is applied between contacts 122 and 124, the path between the electrode 110 and the contact 124 is an open circuit. Generally, the programming voltage is the voltage threshold above the rupture voltage that will cause antifuse 100 to change from an open state to a closed state, by causing a rupture (i.e. a breakdown of insulating layer 111 between electrode 110 and active area 112). Likewise, a programming current is the current above which rupture will occur and cause antifuse 100 to change from an open state to a closed state.

During programming of antifuse element 100, a programming voltage and/or current is applied between contacts 122 and 124. This causes a voltage difference between electrode 110 and the active area 112, which creates a rupture or breakdown of insulating layer 111. This rupture will typically occur at a point where the electric field is the highest.

In accordance with the embodiments described herein, the application of the programming voltage creates a current path through the insulating layer 111 and under the isolation trench 104 to the substrate material proximate to the second side of the isolation trench 104. Specifically, because the programming current flows between contacts 122 and 124, and because those contacts 122, 124 are located on opposite sides of the isolation trench 104, the current path created during programming extends through the insulating layer 111, through the first active area proximate to the first side of the isolation trench 104, under the isolation trench 104 to the second active area proximate to the second side of the isolation trench 104. This current path can cause an increase in the heat generated by the programming current, and this increase in heating can decrease the time needed to reliably program the antifuse. Specifically, the heating of the active area 112 under the insulating layer 111 can decrease the time needed for current to cause a permanent rupture in the insulating layer 111. For example, in one embodiment the antifuse 100 may be reliably programmed by applying a current of 3 mA for approximately 1 ms. As such, the antifuse 100 can provide relatively fast rate of programming compared to other devices.

Furthermore, the increased heat caused by this current path can additionally increase the reliability of the programming by reducing variation in the after programming resistance. For example, in a typical antifuse the heat generation during programming is dependent in large part on the Joule heat determined by program current and electric resistance in the insulating layer (e.g., insulating layer 111). Because the resistance of the insulating layer can vary widely from part to part due to thickness variation, internal mobile charges or defects, there can be a resulting wide variation of heat generation. This wide variation of heat generation can result in high variation of final antifuse resistance.

The antifuse 100 can provide reduced resistance variation after programming by utilizing additional heating during programming. Specifically, by using the resistance of the active area 112 to generate heat during programming. Because the resistance of the active area 112 is well defined by the doping profile the resistance is more consistent than that of the typical insulating layer 111. Thus, the antifuse 100 renders more stable heat generation and reduced variability in the final resistance variation.

As another example, the additional heating can increase reliability by reducing the probability of data flip occurring in response to time. Specifically, because the extra heating helps to keep a wide area of insulator 111 at a uniform and high temperature, a solid current path is formed through the insulator 111. The antifuse 100 can also have increased immunity to data flipping by temperature due to the positive temperature coefficient of resistance of body doping area 116 that can compensate for the negative temperature coefficient of the programmed antifuse insulating layer 111.

Turning now to FIG. 2, a second cross-sectional side view of an antifuse 100 is illustrated. This shows an example of the programming current path 202 extending through the insulating layer 111, through the first active area proximate to the first side of the isolation trench 104, under the isolation trench 104 to the second active area proximate to the second side of the isolation trench 104. Such a current path 202 can be created by applying a suitable current/voltage to contact 122 and 124. Specifically applying a current through the contacts 122 and 124 can cause current to flow through electrode 110, insulating layer 111, the current path 202, and the diffusion region 120. Additionally, because of silicide layer 130 over the doping in the diffusion region 118 some portion of the current will likely spread out through the diffusion region 118 before flowing into the current path 202. This can also cause heating over a relatively wider area. The net effect of this current flow can increase in the heat generated by the current. Specifically, this can cause an increase in the heating of the active area 112 under the insulating layer 111.

Turning now to FIGS. 3A and 3B, a graphical representation of temperature profiles 302 and 304 caused by an exemplary programming current are illustrated. Specifically, the temperature profiles 302 and 304 show exemplary heating along the X and Y axis defined by coordinate axis 204 of FIG. 2. As shown in this example, the embodiments described herein can facilitate heating over a larger portion of the active area 112 (e.g., in the X and Y directions) and a resulting higher magnitude of heating during the application of the programming current. Again, such an increased heating of the active area 112 can decrease the time needed for current to cause a permanent rupture in the insulating layer 111. Furthermore, the increased magnitude of heating can additionally increase the reliability of the programming by reducing variation in the after programming resistance.

In some embodiments the programming time may also be reduced by an increase in resistance in the current path. Specifically, in some embodiments a positive temperature coefficient (TC) of the material along the current path can cause an increase in resistance due to the increase in heat. Thus, the heating of the active area 112 under the insulating layer 111 can cause an increase in resistance. The continued flow of current through this increased resistance can cause even greater heating of the active area 112 under the insulating layer 111. Thus, the positive TC of the material in the active area 112 provides a feedback mechanism that further increases heat and thus can further decrease the time needed to program and increase the reliability of the programming. Furthermore, the positive TC can provide increased robustness to variation in the programming current. Furthermore, the positive TC can prevent damage to the electrode 110 or the contacts 122 and 124 from unexpected high program current.

Furthermore, the positive TC of the body doping area 116 can combine with the negative TC of the programmed insulating layer 111 to provide an antifuse 100 with a relatively flat TC. Such an antifuse 100 may be less likely to erroneously change data states at operational temperature.

Diffusion resistance of silicon shows positive TC by nature. On the other hand, resistance of insulating layer 111 in the programmed antifuse shows negative TC because the resistance includes tunneling a portion of the current transport mechanism.

Figure 4:
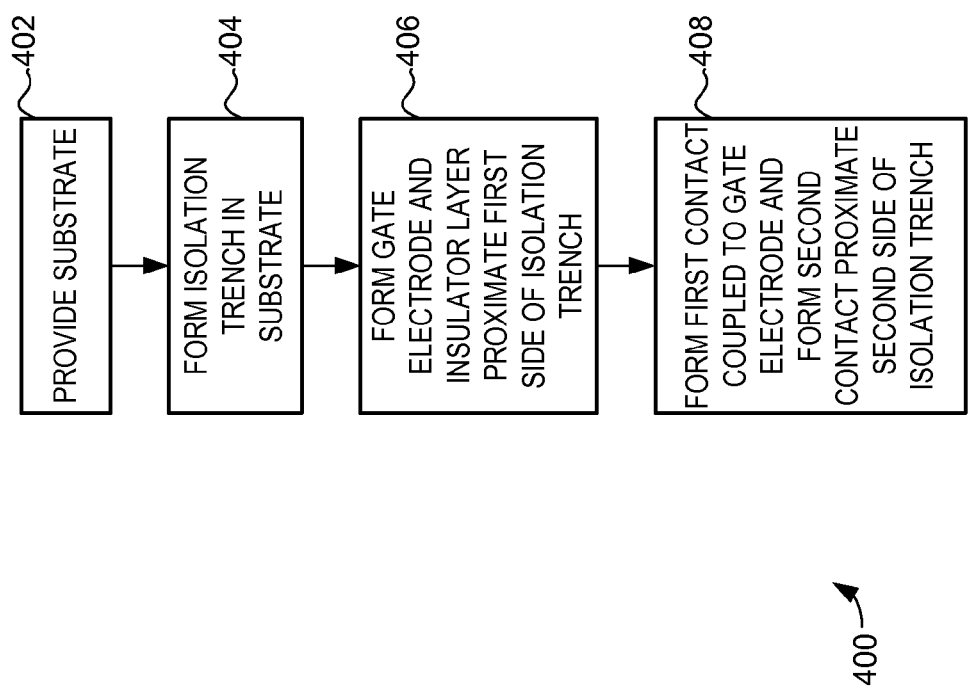
FIG. 4 is a flow diagram of a method of manufacturing an antifuse in accordance with an example embodiment.

Turning now to FIG. 4, a method 400 of forming an antifuse (e.g., antifuse 100) is illustrated. In general, the method 400 fabricates the antifuse using CMOS fabrication techniques, and thus in some embodiments antifuses can be formed on a wafer with other CMOS devices without requiring significant additional processing steps or costs. For example, antifuses can be fabricated using the processing steps that are also used to form NMOS and/or PMOS transistors. In a typical implementation multiple arrays of antifuses and associated devices would be formed on a semiconductor wafer, with each array of antifuses providing a read only memory that can be utilized for circuit trimming and other uses.

The first step 402 in method 400 is to provide a semiconductor substrate (e.g., substrate 102). As described above, any suitable semiconductor substrate can be used. In one embodiment the semiconductor substrate used is a semiconductor-on-insulator (SOI) substrate. In other embodiments the substrate can comprise a standard bulk semiconductor wafer. Furthermore, the semiconductor substrate could comprise relatively pure silicon materials typically used in the semiconductor industry, as well as silicon add-mixed with other elements such as germanium and the like. In addition, other suitable substrate materials, such as substrates including III-V and II-VI materials may be considered in specific instances depending on device requirements.

The step 404 is to form the isolation trench (e.g., trench 104) in the semiconductor substrate. Any suitable technique can be used to form the isolation trench, including the various techniques used to form shallow trench isolation (STI). For example, isolation trenches can be formed by etching a pattern of trenches in the semiconductor substrate, depositing one or more dielectric materials (e.g., silicon dioxide) to fill the trenches, and then removing any excess dielectric using a technique such as chemical-mechanical planarization. Of course, this is just one example and other techniques may also be used.

In some embodiments additional features may be formed after the isolation trenches are formed. For example, the doping profile of the active area can determined with a dopant implant. Such a dopant implant can be used to form an n-well or p-well in the active area (e.g., active area 116). As was described above, in some embodiments the dopant profile of the well can be configured to increase the resistance in the current path of the programming current. For example, it may be desirable to perform the implant with a profile that is light near the surface and relatively heavy near the bottom. In one embodiment the dopant profile comprises a dopant density under the isolation trench that is 10 times the dopant density near the uppermost surface. For example, the dopant profile can comprise a dopant density of about $1e17$ $m^{-3}$ near the uppermost surface and about $1e18$ $m^{-3}$ under the isolation trench. Furthermore, it should be noted that such a dopant profile can provide a relatively high resistance near the surface while not requiring too much overall resistance in the current path. Too much overall resistance in the current path could block current flow and impede programming. Thus, the dopant profile provides high resistance near the surface while reducing resistance where heating is not needed and thus reducing overall resistance.

The step 406 is to form an electrode (e.g., electrode 110) and insulating layer (e.g., insulating layer 111) proximate to a first side of the isolation trench. Again, this can be accomplished using any suitable fabrication process. For example, the insulating layer can be formed by growing gate dielectric (e.g., silicon dioxide) over an active area followed by a deposition of material for the electrode (e.g., polysilicon). The electrode material and insulating layer material are then patterned to define the electrode and the insulating layer. Again, any suitable techniques for patterning can be used.

In some embodiments additional features may be formed after the patterning of the electrode and insulating layer. For example, sidewall spacers may be formed on the edges of the electrode using a conformal deposition and directional etch or other suitable method. Also, diffusion regions (e.g., diffusion regions 118 and 120) can also be implanted at this point using a suitable dopant implant. These diffusion regions can be formed using the same process steps used to form well contacts or source and drain diffusions in transistors.

The step 408 is to form a first contact (e.g., first contact 122) coupled to the electrode and form a second contact (e.g., second contact 124) proximate to the second side of the isolation trench. In general, these contacts can be formed using any suitable back end processing techniques. For example, the contacts may be formed and connected during the formation of the electrode layer, metal wiring layers, vertical interconnects, or any combination thereof.

So formed, the antifuse can be programmed with the application of a programming current or voltage. Specifically, a voltage or current applied between the contacts creates a current path through the insulating layer and under the isolation trench to the substrate material proximate the second side of the isolation trench. This current path increases the heating of the area under the insulating layer, and this can result in faster programming time. Specifically, because the current path has increased resistance the programming current will create increased heat in the area under the insulating layer. This causes a wider portion of the area under the isolation layer to be heated, increased magnitude of heating, and reduced time needed for the current to rupture the insulating layer and program antifuse.

In one embodiment a method of programming an element is provided. The method comprises providing an antifuse, the antifuse including: a substrate material; an isolation trench formed in the substrate material, the isolation trench having a first side and a second side opposite the first side; an electrode positioned above the substrate material and having at least a portion proximate to the first side of the isolation trench; and an insulating layer disposed between the electrode and the substrate material. The method further comprises applying a voltage between the electrode and the substrate material sufficient to cause a rupture in the insulating layer and create a current path from the electrode through the insulating layer and under the isolation trench to the substrate material proximate the second side of the isolation trench.

In another embodiment the antifuse comprises a substrate material; a shallow trench isolation formed in the substrate material, the shallow trench isolation having a first side and a second side opposite the first side; a first active area formed at an uppermost surface of the substrate material and proximate to the first side of the shallow trench isolation, and a second active area formed at the uppermost surface of the substrate material and proximate to the second side of the shallow trench isolation, wherein the first active area and the second active area each comprise an electrically conductive doped region, and wherein the first active area has a dopant profile that is relatively low near the uppermost surface and relatively high near a bottom of the shallow trench isolation, and wherein the first active area has a positive temperature coefficient of resistance near the uppermost surface; an electrode positioned above the substrate material and proximate to the first side of the shallow trench isolation; a first contact electrically coupled to the electrode and a second contact electrically coupled to the second active area; and an insulating layer disposed between the electrode and the first active area such that voltage applied between the first contact and the second contact causes a rupture in the insulating layer and creates a current path through the insulating layer, the first active area, and under the shallow trench isolation to the second active area proximate the second side of the shallow trench isolation.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An antifuse element comprising:
    a substrate material;
    an isolation trench formed in the substrate material, the isolation trench having a first side and a second side opposite the first side;
    an electrode positioned above the substrate material and having at least a portion proximate to the first side of the isolation trench; and
    an insulating layer disposed between the electrode and the substrate material such that voltage of a threshold applied between the electrode and the substrate material causes a rupture in the insulating layer and creates a current path from the electrode through the insulating layer and under the isolation trench to the substrate material proximate the second side of the isolation trench;
    a first contact electrically coupled to the electrode and a second contact electrically coupled to the substrate material proximate the second side of the isolation trench, and wherein the current path is created between the first contact and the second contact.

2. The antifuse element of claim 1 further comprising a first active area formed at an uppermost surface of the substrate material and proximate to the first side of the isolation trench, and a second active area formed at the uppermost surface of the substrate material and proximate to the second side of the isolation trench, wherein the first active area and the second active area each comprise an electrically conductive doped region.

3. The antifuse element of claim 2 wherein the first active area has a dopant profile that is relatively low near the uppermost surface and relatively high under the isolation trench.

4. The antifuse element of claim 3 wherein the dopant profile is selected to provide a positive temperature coefficient of resistance near the uppermost surface.

5. The antifuse element of claim 3 wherein the dopant profile comprises a dopant density under the isolation trench that is at least 10 times a dopant density near the uppermost surface.

6. The antifuse element of claim 1 wherein the substrate material is a semiconductor material.

7. The antifuse element of claim 1 wherein the insulating layer comprises an oxide.

8. The antifuse element of claim 1 further comprising a first diffusion region implanted in the substrate material proximate the electrode and the first side of the isolation trench, and wherein no contact is formed contacting the first diffusion region.

9. A method of forming an antifuse element, the method comprising:
    forming an isolation trench in a substrate, the isolation trench having a first side and a second side opposite the first side;
    forming a first active area and a second active area, the first active area formed at an uppermost surface of the substrate material and proximate to the first side of the isolation trench, the second active area formed at the uppermost surface of the substrate material and proximate to the second side of the isolation trench;
    forming an insulating layer on the substrate material; and
    forming an electrode over the insulating layer, the electrode including at least a portion positioned above the first active area, such that a programming voltage applied between the electrode and the substrate material causes a rupture in the insulating layer and creates a current path through the insulating layer and under the isolation trench to the second active area proximate the second side of the isolation trench;
    forming a first contact electrically coupled to the electrode and a second contact electrically coupled to the substrate material proximate the second side of the isolation trench.

10. The method of claim 9 wherein the first active area is formed to have a dopant profile that is relatively low near the uppermost surface and relatively high under the isolation trench.

11. The method of claim 9 wherein the first active area is formed to have a dopant profile that provides a positive temperature coefficient of resistance near the uppermost surface.

12. The method of claim 11 wherein the dopant profile comprises a dopant density under the isolation trench that is at least 10 times a dopant density near the uppermost surface.

13. The method of claim 9 wherein the substrate material is a semiconductor material.

14. The method of claim 9 wherein the insulating layer comprises a gate oxide.

15. The method of claim 9 further comprising a implanting a first diffusion region in the substrate material proximate the electrode and the first side of the isolation trench.

16. The method of claim 9 wherein the current path is created between the first contact and the second contact.

17. A method of programming an element comprising:
providing an antifuse, the antifuse including:
a substrate material;
an isolation trench formed in the substrate material, the isolation trench having a first side and a second side opposite the first side;
an electrode positioned above the substrate material and having at least a portion proximate to the first side of the isolation trench; and
an insulating layer disposed between the electrode and the substrate material; and
applying a voltage between the electrode and the substrate material sufficient to cause a rupture in the insulating layer and create a current path from the electrode through the insulating layer and under the isolation trench to a contact electrically coupled to the substrate material proximate the second side of the isolation trench.

18. The method of claim 17 wherein the antifuse further comprises a first active area formed at an uppermost surface of the substrate material and proximate to the first side of the isolation trench, and a second active area formed at the uppermost surface of the substrate material and proximate to the second side of the isolation trench, wherein the first active area and the second active area each comprise an electrically conductive doped region, and wherein the first active area has a dopant profile that is relatively low near the uppermost surface and relatively high under the isolation trench.

19. The method of claim 18 wherein dopant profile comprises a dopant density under the isolation trench that is at least 10 times a dopant density near the uppermost surface.

* * * * *